(12) United States Patent
Davis et al.

(10) Patent No.: US 9,594,113 B2
(45) Date of Patent: Mar. 14, 2017

(54) PACKAGE ON PACKAGE THERMAL FORCING DEVICE

(71) Applicant: SENSATA TECHNOLOGIES, INC., Attleboro, MA (US)

(72) Inventors: Richard A. Davis, Peoria, AZ (US); Christopher Lopez, Phoenix, AZ (US)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 321 days.

(21) Appl. No.: 14/186,733

(22) Filed: Feb. 21, 2014

(65) Prior Publication Data

US 2015/0241478 A1    Aug. 27, 2015

(51) Int. Cl.
*G01R 31/28*   (2006.01)
*G01R 1/067*   (2006.01)
*G01R 1/20*    (2006.01)

(52) U.S. Cl.
CPC ..... *G01R 31/2874* (2013.01); *G01R 31/2817* (2013.01); *G01R 1/20* (2013.01)

(58) Field of Classification Search
CPC ....... G01R 31/28–31/2898; G01R 1/20; G01R 1/0433; G01R 1/067

USPC ........................................ 324/750.01–756.07
See application file for complete search history.

(56) References Cited

U.S. PATENT DOCUMENTS

| 6,636,062 | B2* | 10/2003 | Gaasch | G01R 1/0458 |
| | | | | 324/750.03 |
| 9,341,671 | B2* | 5/2016 | Wang | G01R 31/2867 |
| 2015/0084657 | A1* | 3/2015 | Clairet | G01R 31/2875 |
| | | | | 324/750.03 |

* cited by examiner

*Primary Examiner* — Melissa Koval
*Assistant Examiner* — Rahul Maini
(74) *Attorney, Agent, or Firm* — Adler Pollock & Sheehan P.C.; George N. Chaclas; Daniel J. Holmander

(57) ABSTRACT

Methods and apparatus for a package on package (POP) thermal forcing device. A thermal interposer includes a test probe guide and insulator top, a thermal conductor, the test probe guide and insulator top affixed to a top surface of the thermal conductor, a test probe, and a test probe guide and insulator bottom affixed to a bottom surface of the thermal conductor, the test probe guide and insulator bottom configured in a ring-like shape to enable the thermal conductor to pass through and make contact with a bottom of a package on package (PoP) integrated circuit (IC).

10 Claims, 3 Drawing Sheets

PACKAGE ON PACKAGE THERMAL FORCING DEVICE

BACKGROUND OF THE INVENTION

The invention generally relates integrated circuit (IC) testing, and more specifically to a package on package thermal forcing device.

In general, package on package (PoP) is an integrated circuit packaging method to combine vertically discrete logic and memory ball grid array (BGA) packages. Two or more packages are installed atop each other, i.e. stacked, with a standard interface to route signals between them. This enables higher component density in devices, such as mobile phones, personal digital assistants (PDA), and digital cameras.

During testing of integrated circuits (ICs) in a PoP format, it is necessary to control both a top package (e.g., memory) and a bottom package (e.g., logic) at a temperature to validate proper operation of the ICs in extreme environments. However, prior approaches only enable control of the logic device (i.e., the power generator) through the memory and test contactor interposer. Controlling the logic device is extremely inefficient due to a thermal impedance through the top device and the interposer.

SUMMARY OF THE INVENTION

The following presents a simplified summary of the innovation in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides methods and apparatus for a package on package (POP) thermal forcing device.

In general, in one aspect, the invention features a thermal interposer including a test probe guide and insulator top, a thermal conductor, the test probe guide and insulator top affixed to a top surface of the thermal conductor, a test probe, and a test probe guide and insulator bottom affixed to a bottom surface of the thermal conductor, the test probe guide and insulator bottom configured in a ring-like shape to enable the thermal conductor to pass through and make contact with a bottom of a package on package (PoP) integrated circuit (IC).

In another aspect, the invention features a system including a thermal device plunger linked to a thermal control unit (TCU), and a thermal interposer, the thermal interposer linked to the thermal device plunger and a test socket through a TCU latch adapter, the thermal interposer transferring electrical connections between a top package and a bottom package of a package on package (PoP) integrated circuit (IC), the thermal interposer transferring temperature between the thermal device plunger and the bottom package.

Embodiments of the invention may have one or more of the following advantages.

The system enables direct contact of two separate IC's in a vertical arrangement and maintains a temperature of both during temperature forcing.

The system provides for uniform temperature of both IC's where previous solutions when arranged in a vertical format resulted in one IC to be either excessively low or high depending upon which temperature is being achieved.

The system enables a tooled approach that can be used in ATE handlers, System Level Handlers and Bench applications.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The invention will be more fully understood by reference to the detailed description, in conjunction with the following figures, wherein.

DETAILED DESCRIPTION

Figure 1:
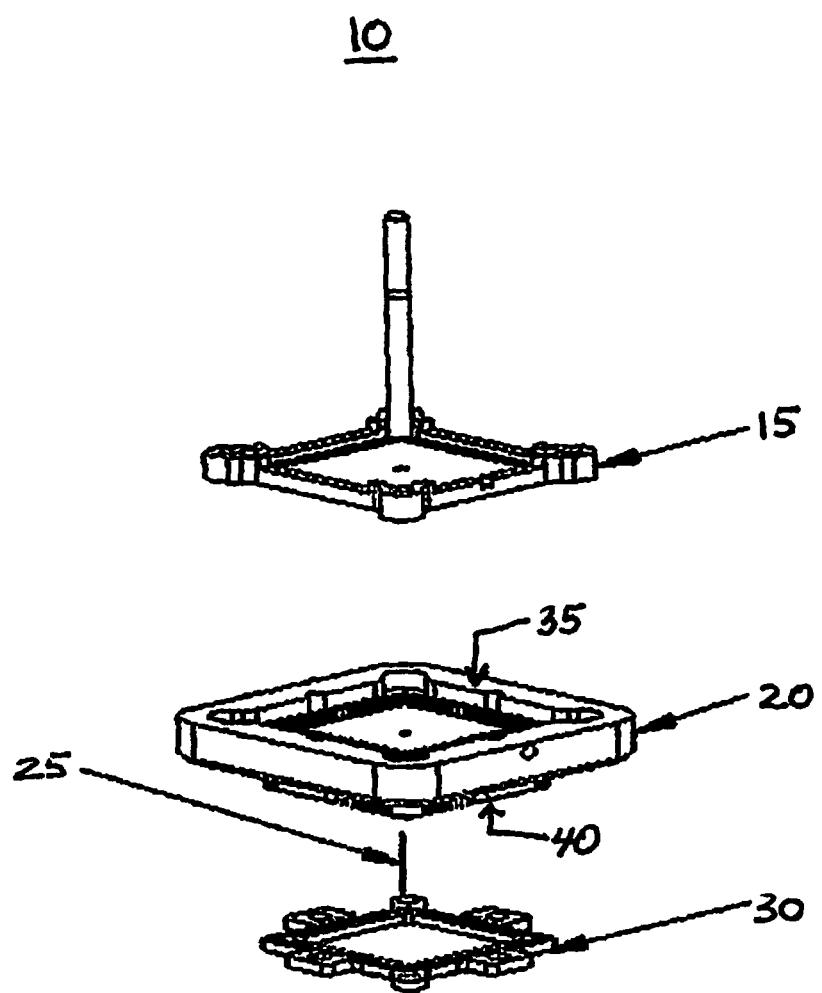
FIG. 1 is a block diagram of an exemplary thermal interposer in accordance with the present invention.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

In the description below, the term "or" is intended to mean an inclusive "or" rather than an exclusive "or." That is, unless specified otherwise, or clear from context, "X employs A or B" is intended to mean any of the natural inclusive permutations. That is, if X employs A, X employs B, or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

The present invention is a tooled device adapter that simultaneously contacts a top IC, usually a memory, and a bottom IC, usually logic, during thermal testing and maintains a temperature of both ICs through a wide temperature range, such as, for example, −55° C. to +150° C. While thermal contact is maintained, electrical contact between the two ICs is also maintained for a seamless test suite over temperature for a wide range of IC manufacturers during performance of Automated Test Equipment (ATE), System Level Testing (SLT) and bench testing.

The present invention may be configured for use when the device under test includes a memory device on top and a logic on a bottom, a logic device on the top and a memory on the bottom, and for devices other than PoP ICs, such as, for example, an ASIC, other memory device, and so forth.

Semiconductor devices, i.e., integrated circuits, are tested after packaging to identify those devices that are likely to fail shortly after being put into use. This test is often described as a "burn-in test." The burn-in test thermally and electrically stresses the semiconductor devices to accelerate the failure of those devices that would otherwise fail early on. This ensures that the devices sold to customers are more reliable. In a standard PoP arrangement, a lower device is nested in a socket and an interposer is presented that enables electrical contact but not thermal contact since the interposer is typically made of plastic. Thus, a heat flow path for this prior approach is poor and typically only the top device sees a proper temperature.

As shown in FIG. 1, an exemplary thermal interposer 10 in accordance with the present invention includes a test probe guide and insulator top 15, a thermal conductor 20, a test probe 25 and a test probe guide and insulator bottom 30. The test probe guide and insulator top 15 is affixed or secured to a top surface 35 of the thermal conductor 20.

The test probe guide and insulator bottom 30 is affixed or secured to a bottom surface 40 of the thermal conductor 20.

In one embodiment, the test probe guide and insulator bottom 30 is configured in a ring-like shape to enable the thermal conductor 20 to pass through and touch a bottom of a package on package (PoP) IC (not shown). In other embodiments, other shapes may be employed.

The thermal conductor 20 is designed to be thermally conductive and electrically insulating. Thermally conductive materials include, for example, aluminum, copper, and aluminum nitride, and electrically insulative materials include, for example, amorphous thermoplastic polyetherimide (PEI) resins, ceramic-filled polyetheretherketone (PEEK) compounds, ceramics, and other engineered plastics.

Figure 2:
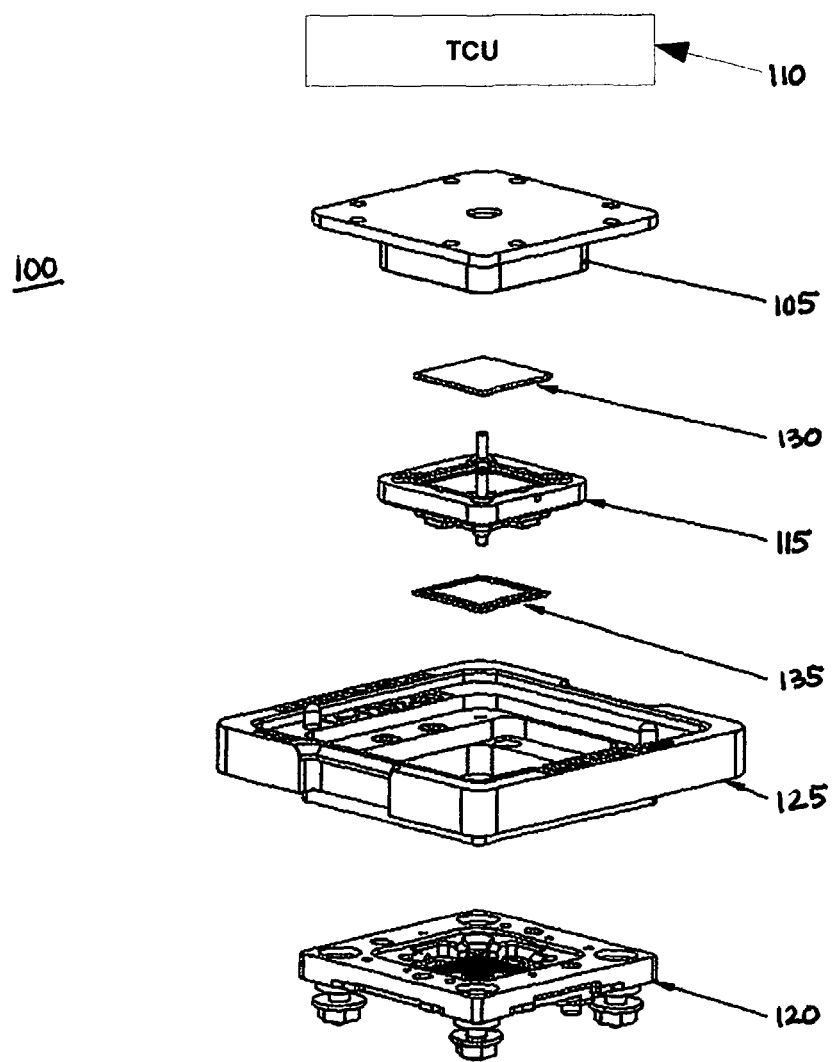
FIG. 2 is a block diagram of an exemplary system incorporating the exemplary thermal interposer of the present invention.

As shown in FIG. 2, an exemplary system 100 includes a thermal device plunger 105 linked to a thermal control unit (TCU) 110.

The system 100 includes a thermal interposer 115 linked to the thermal device plunger 105 and a test socket 120 through a TCU latch adapter 125.

The thermal interposer 115 transfers electrical connections between a top package 130 and a bottom package 135 of a package on package (PoP) integrated circuit (IC). In an embodiment, the top package 130 is a memory and the bottom package 135 is a logic.

The thermal interposer 115 also transfers temperature between the thermal device plunger 105 and the bottom package 135 of the PoP IC.

The thermal interposer 115 is constructed of one or more thermal conductive materials and one or more electrically isolating materials.

The thermal device plunger 105 applies a force from the TCU 110 to the top 130 of the PoP IC and to the thermal interposer 115. The TCU latch adapter 125 enables the TCU 110 to latch on to the test socket 120. The test socket 120 makes an electrical connection between the bottom 135 of the PoP IC and a load board (not shown).

The system 100 enables use of a direct contact to control two electrically integrated IC's to the same temperature without understress or overstress to the IC's. The system 100 does not require the use of liquids or fluids for control.

The system 100 provides for high power handling capability and presents a flexible approach with minimal system tooling for different packages.

The system 100 is adapted to standard interconnect methodologies while implementing a compact approach with precise control with a sensor present at point of use.

The system 100 eliminates a risk of overstress of a top stacked IC, usually memory, during testing, and enables a fast ramp temperature response.

Figure 3:
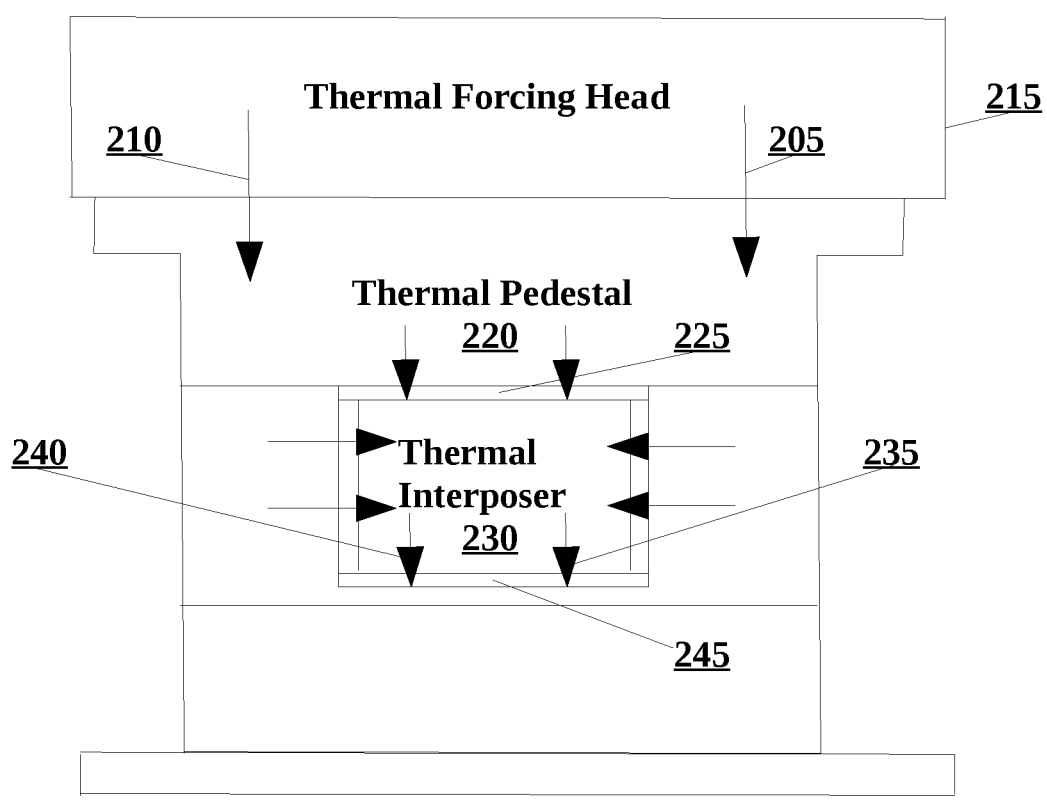
FIG. 3 is an exemplary diagram of a heat flow resulting from the incorporation of the exemplary thermal interposer of the present invention.

As shown in FIG. 3, a diagram 200 illustrates the system 100 implements a thermal forcing solution that changes the temperature of the thermal pedestal which is in direct contact with the top package and the thermal interposer. Heat flows 205, 210 move from/through the thermal forcing head 215 into the thermal pedestal 220, which contacts a top portion 225 of the thermal interposer 230. Heat flows 235, 240 move from/through and around the thermal interposer 230, enabling contact with a bottom portion 245 of the thermal interposer 230.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

What is claimed is:

1. A thermal interposer comprising:
a test probe guide/insulator top;
a thermal conductor comprising a generally rectangular ring composed of thermally conductive and electrically insulating materials and adapted to receive the test probe guide/insulator top through an upper portion of the ring and a test probe guide/insulator bottom through a lower portion of the ring, the test probe guide/insulator top affixed to a top surface of the thermal conductor;
a test probe;
the test probe guide/insulator bottom affixed to a bottom surface of the thermal conductor, the test probe guide/insulator bottom configured to enable the thermal conductor to pass through and make contact with a bottom chip of a package on package (PoP) integrated circuit (IC); and
a plunger for communicating heat from a thermal control unit to the thermal conductor and, thereby to a top chip of the PoP IC so that the top chip and the bottom chip are efficiently and directly heated by thermal contact with the thermal conductor.

2. The thermal interposer of claim 1 wherein the test probe guide/insulator bottom comprises:
a generally rectangular ring;
apertures positioned at corners in the ring; and
alignment pins positioned through the apertures.

3. The thermal interposer of claim 2 wherein the thermally conductive material is selected from the group consisting of aluminum, copper, and aluminum nitride.

4. The thermal interposer of claim 2 wherein the electrically insulating material is selected from the group consisting of an amorphous thermoplastic polyetherimide (PEI) resin, a ceramic-filled polyehteretherketone (PEEK) compound, a ceramic, and an engineered plastic.

5. A system for burn-in testing of a package on package (PoP) integrated circuit (IC) without use of liquids or fluids for temperature control, the PoP IC having a bottom logic package and a top memory package stacked on the logic package, the system comprising:

a thermal control unit (TCU);

a plunger linked to the TCU;

a thermal interposer for transferring heat from the plunger and the logic package and for transferring electrical connections between the bottom logic package and the top memory package, the thermal interposer including:

a test probe insulator top; and a thermal conductor comprising a generally rectangular ring composed of thermally conductive and electrically isolative material, the thermal conductor having a top surface in direct contact with the top memory package and a bottom surface in direct contact with the bottom logic package, wherein the thermal conductor is heated by the TCU via the plunger; and a test probe insulator bottom to enable the thermal conductor to make contact with a bottom of the bottom logic package, wherein the test probe insulator top and bottom are fixed to the thermal conductor.

6. The system of claim 5, wherein the TCU, the plunger and the thermal interposer maintain a substantially uniform temperature of the logic and memory packages during testing.

7. The system of claim 6, wherein the substantially uniform temperature is between −55° C. and +150° C.

8. The system of claim 5, wherein the TCU applies a force to seat the plunger, thermal interposer, and PoP IC together.

9. The system of claim 5, wherein the TCU, the plunger and the thermal interposer are solid for efficient conduction of heat without fluid conduits and the plunger applies a force from the TCU to the top surface.

10. The system of claim 5, wherein the bottom logic package and the top memory package are a memory chip and a logic chip, respectively.

* * * * *